(12) United States Patent
He (10) Patent No.: US 8,260,223 B2
(45) Date of Patent: Sep. 4, 2012

(54) DUAL-MODE MIXER CIRCUIT AND METHOD

(75) Inventor: Xin He, Waalre (NL)

(73) Assignee: NXP B.V., Eindhoven (NL)

( * ) Notice: Subject to any disclaimer, the term of this patent is extended or adjusted under 35 U.S.C. 154(b) by 322 days.

(21) Appl. No.: 12/598,764

(22) PCT Filed: May 8, 2008

(86) PCT No.: PCT/IB2008/051819
§ 371 (c)(1),
(2), (4) Date: Nov. 4, 2009

(87) PCT Pub. No.: WO2008/139390
PCT Pub. Date: Nov. 20, 2008

(65) Prior Publication Data
US 2010/0120377 A1    May 13, 2010

(30) Foreign Application Priority Data
May 11, 2007  (EP) .................................... 07108066

(51) Int. Cl.
*H04B 14/00* (2006.01)
(52) U.S. Cl. ..................... 455/120; 455/189.1; 455/209; 455/326
(58) Field of Classification Search .................. 455/120, 455/189.1, 209, 317–319, 326
See application file for complete search history.

(56) References Cited

U.S. PATENT DOCUMENTS

| | | | |
|---|---|---|---|
| 4,598,259 A * | 7/1986 | Gontowski, Jr. ............. | 331/111 |
| 6,535,748 B1 | 3/2003 | Vuorio et al. | |
| 7,130,604 B1 * | 10/2006 | Wong et al. ................... | 455/302 |
| 2004/0014446 A1 | 1/2004 | Chakraborty et al. | |
| 2004/0063419 A1 | 4/2004 | Molnar et al. | |
| 2005/0060119 A1 | 3/2005 | Frank et al. | |
| 2006/0003717 A1 | 1/2006 | Sowlati | |
| 2006/0039505 A1 | 2/2006 | Kim | |
| 2007/0042743 A1 | 2/2007 | Ali et al. | |

FOREIGN PATENT DOCUMENTS

GB    2324919 A    11/1998

OTHER PUBLICATIONS

International Search Report for Int'l. Application No. PCT/IB2008/051819 (Aug. 21, 2008).

* cited by examiner

*Primary Examiner* — Edward Urban
*Assistant Examiner* — Stacey Sorawat (57) ABSTRACT

The present invention relates to a mixer circuit and method of frequency transformation, wherein an input signal is switched in accordance with a first local oscillator signal and in accordance with at least one second local oscillator signal having a smaller duty cycle than said first local oscillator signal, or having a respective predetermined phase shift with respect to said first local oscillator signal. Output signals obtained by the switching in accordance with the first and at least one second local oscillator signals are summed and the polarity of one of said first local oscillator signal and said at least one second local oscillator signal is switched in response to a control input, to thereby switch between a harmonic-rejection mode and a sub-harmonic mixing mode.

13 Claims, 9 Drawing Sheets

DUAL-MODE MIXER CIRCUIT AND METHOD

FIELD OF THE INVENTION

The present invention relates to a mixer circuit and method of frequency transformation, which can be used for example in transceiver, transmitter or receiver applications of wireless systems.

BACKGROUND OF THE INVENTION

Increasing demand for transceiver devices with small form factors has motivated research on highly integrated low-cost transmitter and receiver circuits. Direct conversion transmitter and receiver circuits can simplify the signal path by translating a desired radio frequency (RF) spectrum to a zero intermediate frequency (IF) via a single mixing stage or circuit, and thus effectively eliminate image frequency problems and hence expensive and bulky off-chip image-reject filters required in conventional heterodyne receivers. It also allows for channel selection to be performed at baseband with a simple low-pass filtering prior to a high dynamic analog-to-digital conversion. Therefore, the direct conversion approach can offer highly integrated, low-cost, low-power and multi-standard solutions e.g. for wireless products. However, several problems such as direct current (DC) offset still exist in direct conversion architectures. To solve these problems main efforts have been put on factory calibration, thus increasing testing time and hence costs.

An alternative approach to avoid DC offsets is to employ a sub-harmonic mixer (which may also be called harmonic mixer), where the local oscillator (LO) frequency operates at an integer division of the RF input frequency. The specific case of an integer division of "2" is also referred to in the literature as even-harmonic mixer (EHM). The sub-harmonic mixer functions transform a desired RF frequency into baseband, while rejecting the fundamental LO frequency. In practice, sub-harmonic mixer functions can be implemented by passive or active circuitry, wherein both configurations require an additional 45-degree phase shift in LO signal generation to obtain both in-phase (I) and quadrature phase (Q) channels in baseband.

On the other hand, in digital video broadcast (DVB) receivers there is a demand to reject interferences at 3rd order and 5th order harmonics of the desired carrier frequencies, which interferences are introduced by strong transmission signals of 2nd generation (2G) and 3rd generation (3G) wireless applications and cannot be completely filtered out by RF filters. Therefore, a harmonic-rejection mixer is necessary for enabling co-existence of mobile television and cellular applications.

Similar to direct conversion receiver architectures, direct up-conversion is increasingly used in transmitter architectures, due to its high level of integration. As the LO frequency is equal to the carrier frequency, intermediate up-conversion employed in dual up-conversion architectures can be eliminated. Therefore, the image problem is no longer present and discrete RF filters with high quality factors Q are not required before the power amplifier (PA). However, the direct up-conversion architecture suffers from a so-called LO pulling problem. Despite various shielding techniques employed in transmitter design, the strong PA output may still be coupled to a voltage controlled oscillator (VCO) circuit which generates the LO signal, and may thus corrupt the LO spectrum (which is called "LO pulling"). The phenomenon of LO pulling is alleviated if the interference is far away from the LO frequency. Usually, a VCO circuit with frequency two times the carrier frequency is thus used, followed by a divide-by-two circuit. The LO pulling problem can thus be solved by doubling the VCO frequency.

Unfortunately, another mechanism called VCO remodulation still exists if the PA needs to be integrated with the RF transceiver into the same chip, for example in a Bluetooth application. Then, the second harmonic of the PA output will modulate the VCO circuit, resulting in RF spurs at the carrier offset of three times the IF input frequency. In principle, the VCO frequency cannot be an integer multiple of the carrier frequency, and vice versa. A possible solution is to resort to a very complex LO generation scheme where the VCO frequency is a fraction of the carrier frequency, such as for example 4/3.

SUMMARY OF THE INVENTION

An object of the present invention is to provide a mixer circuit and mixing method, by means of which a flexible and efficient transmitter or receiver architecture can be achieved.

This object is achieved by a mixer circuit as claimed in claim 1 and by a method as claimed in claim 9.

Accordingly, a dual-mode mixer concept is suggested, which can be configured either in the harmonic-rejection mode or in the sub-harmonic mode. When applied to frequency down-conversion, the sub-harmonic mixer translates or transform the frequency of the RF input at 3rd order and 5th order harmonics of the LO frequency to baseband frequency, thus eliminating the DC offset problem. The proposed solution is also advantageous for high frequency applications where the VCO and the frequency divider are difficult to implement, since the LO required in the sub-harmonic mixer can only be one third or one fifth of the desired RF frequency. By switching the polarity of one of the first and at least one second local oscillator signals, the original sub-harmonic mixer can be operated as a harmonic-rejection mixer. This extends the RF range of the mixer circuit which is thus applicable for multi-standard applications.

When applied to frequency up-conversion, the use of an odd-harmonic mixer can eliminate the VCO remodulation problem without requiring a frequency tripler. Therefore, the chip area as well as the power consumption can be reduced significantly.

According to a first aspect, the first local oscillator signal can be a 50% duty cycle signal and the at least one second local oscillator signal can be a 25% duty cycle signal.

According to a second aspect, the first local oscillator signal can be a first one of four phases generated by a divide-by-four circuit, and the at least one second switching arrangement may comprise two switching arrangements switched in accordance with a second and, respectively, third one of said four phases generated by said divide-by-four circuit.

The proposed mixer circuit may be configured to operate as a frequency down-converter or alternatively as a frequency up-converter and can thus be used in receiver and transmitter circuits as well.

Further advantageous embodiments are defined in the dependent claims.

BRIEF DESCRIPTION OF THE DRAWINGS

In the following, the present invention will be described in greater detail based on embodiments with reference to the accompanying drawings in which.

DESCRIPTION OF THE EMBODIMENTS

Various embodiments of the present invention will now be described based on mixer circuits for direct conversion receiver and transmitter architectures in wireless systems.

Figure 1:
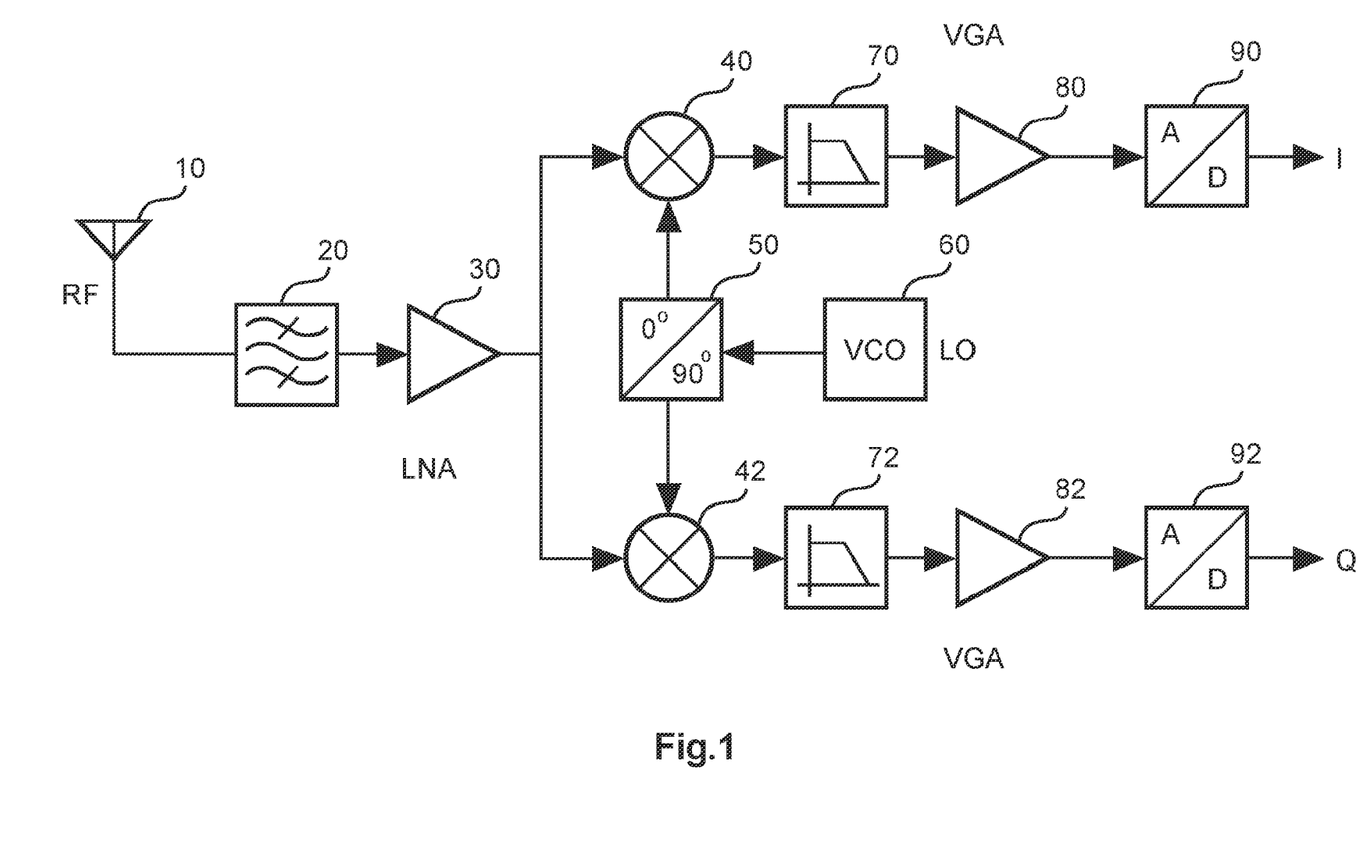
FIG. 1 shows a schematic block diagram of a direct conversion receiver architecture in which the present invention can be implemented.

FIG. 1 shows a schematic block diagram of a direct conversion receiver in which the embodiments can be implemented. The receiver architecture comprises an RF antenna 10 for receiving a desired RF spectrum which is filtered by a band pass filter 20 and then supplied to a low noise amplifier (LNA) 30 before being split into an upper branch for separating an I component of the received signal and a lower branch for separating a Q component. In the upper branch the received signal is supplied to a first mixer circuit 40 to which an in-phase local oscillator signal generated by a voltage controlled oscillator (VCO) 60 and a phase shifting circuit 50 is supplied in order to extract the I component. The mixer output signal is supplied to a low pass filter 70 and then via a variable gain amplifier (VGA) 80 to an analog-to-digital converter (ADC) 90 which generates a digital I output. Similarly, the received signal is supplied to a second mixer circuit 42 to which a quadrature phase local oscillator signal is supplied from the local oscillator circuit in order to generate the Q component which is filtered in a low pass filter 72 and supplied to an ADC 92 via a VGA 82 to obtain a digital Q component.

The local oscillator circuit thus comprises the VCO 60 which output signal is supplied to the phase shifting circuit 50 to generate the in-phase and quadrature phase local oscillator signals.

According to the proposed embodiments, a dual-mode harmonic-rejection and sub-harmonic mixer for frequency translation is proposed, which can be configured either as an odd-harmonic-rejection mixer or as a sub-harmonic mixer depending on a switched polarity of at least one local oscillator signal or component. When the sub-harmonic mixer operates as a frequency down-conversion mixer in a receiver, e.g. as shown in FIG. 1, it rejects RF at fundamental frequency of the local oscillator, while it down-converts the RF input of 3rd order and 5th order harmonics of the local oscillator signal to baseband. When the sub-harmonic mixer operates as a frequency up-conversion mixer in a transmitter, it up-converts the baseband input to RF only at the 3rd order and 5th order harmonics of the local oscillator. Such a sub-harmonic mixer can readily be applied to RF systems on chip (SoC) where the PA is integrated into the same chip with the RF transceiver, thereby eliminating the initially mentioned VCO remodulation problem in the transmitter part.

Accordingly, there are two working modes for the proposed mixer circuit, namely a harmonic reject and a sub-harmonic mode. By inverting the polarity of a local oscillator signal or component, the harmonic-rejection mixer can now be switched to a sub-harmonic mode.

Figure 2:
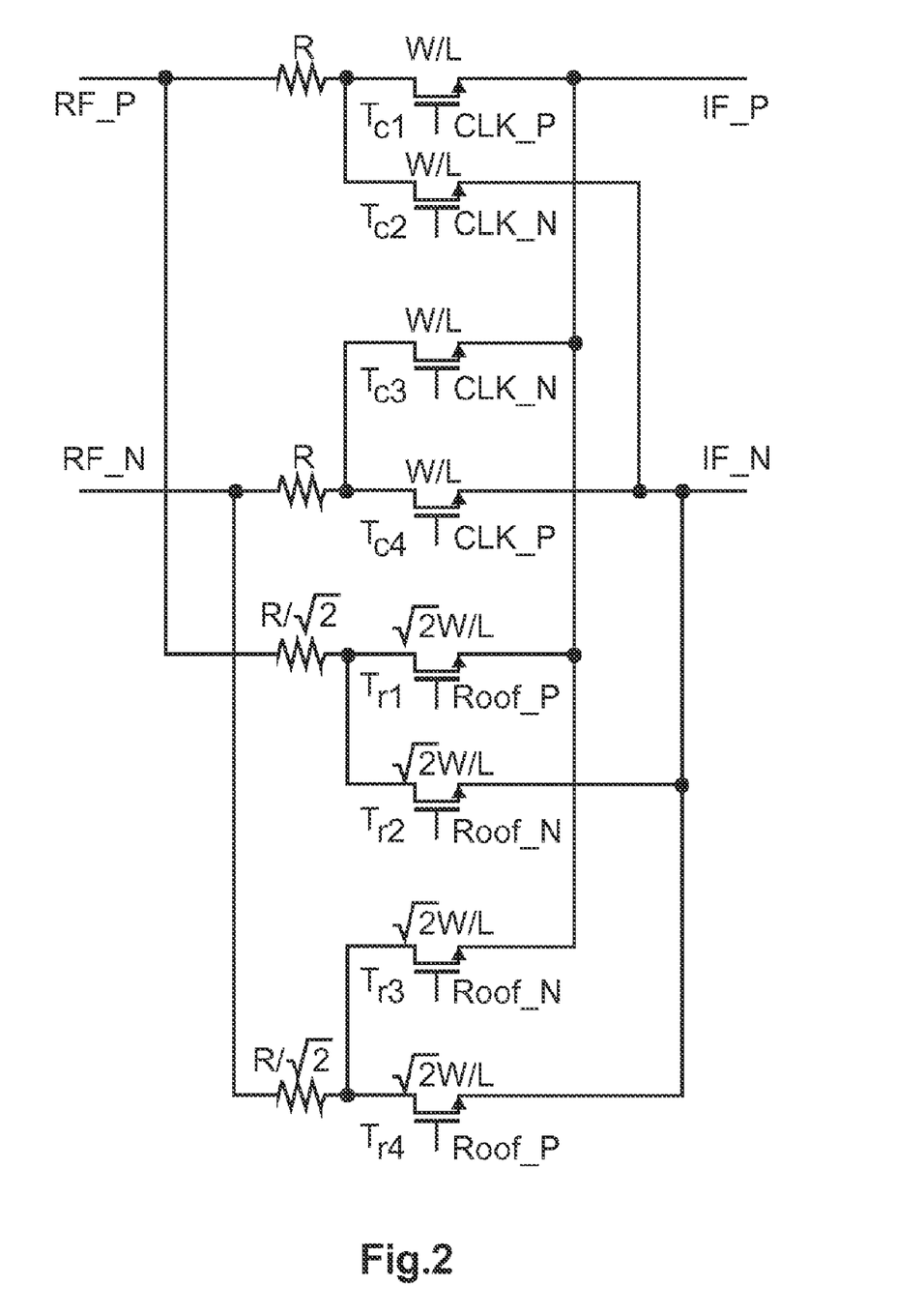
FIG. 2 shows a mixer circuit in a harmonic-rejection mode according to an embodiment.

FIG. 2 shows a schematic circuit diagram of a mixer circuit according to a first embodiment in a harmonic-rejection mode. This mixer circuit comprises two NMOS (N-channel metal oxide semiconductor) switching cores, wherein the upper switching core comprises transistors $T_{c1}$, $T_{c2}$, $T_{c3}$ and $T_{c4}$ which are fed by 50% duty cycle local oscillator signals of positive polarity (CLK_P) and negative polarity (CLK_N), respectively, and a lower switching core which comprises transistors $T_{r1}$, $T_{r2}$, $T_{r3}$ and $T_{r4}$ which are fed by 25% duty cycle local oscillator signals of positive polarity (Roof_P) and negative polarity (Roof_N), respectively. By setting the transistor widths in the lower switching core $\sqrt{2}$ times the transistor widths in the upper switching core, and the resistance in the lower switching core $1/\sqrt{2}$ times the resistance in the upper switching core, the current yielded in the bottom switching core is $\sqrt{2}$ times the current yielded in the upper switching core when they are both switched on. Due to the current summing at the output terminals, envelopes of the output waveforms IF_P and IF_N emulate a sine wave and thus reject RF interference at frequencies of 3rd order and 5th order harmonics of the local oscillator, while transforming the input RF signal RF_P and RF_N to baseband.

Figure 3:
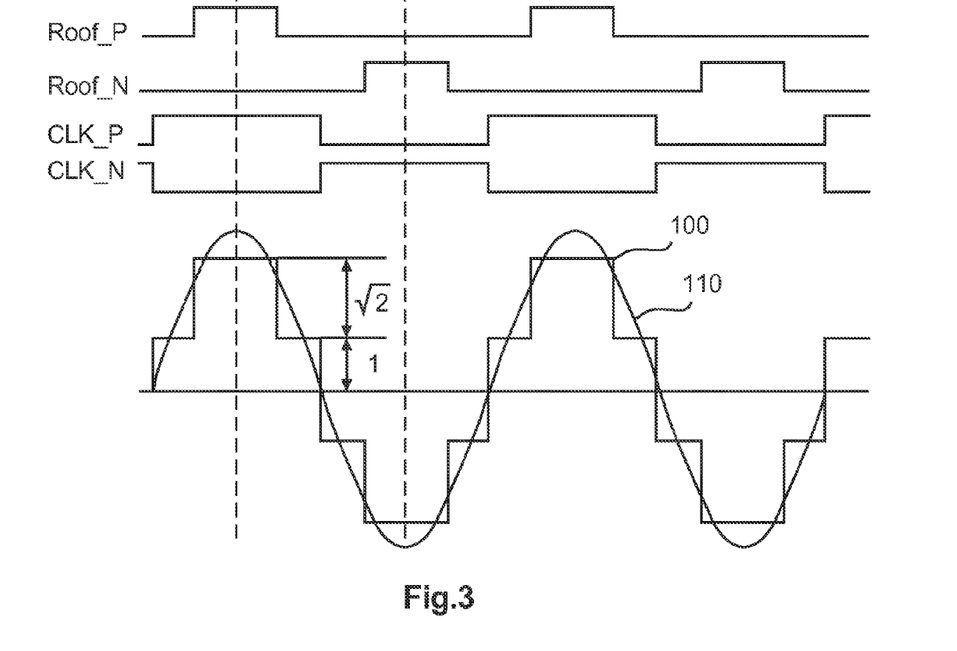
FIG. 3 shows local oscillator waveforms in a mixer circuit according to the embodiment.

FIG. 3 shows schematic waveforms of the positive and negative 50% and 25% local oscillator signals and the resulting output signal IF_P of the mixer circuit of FIG. 2. Due to the different current values of the above upper and lower switching cores, different step sizes of the output signal 100 of the mixer circuit are obtain to optimize emulation the sine wave 110.

Figure 4:
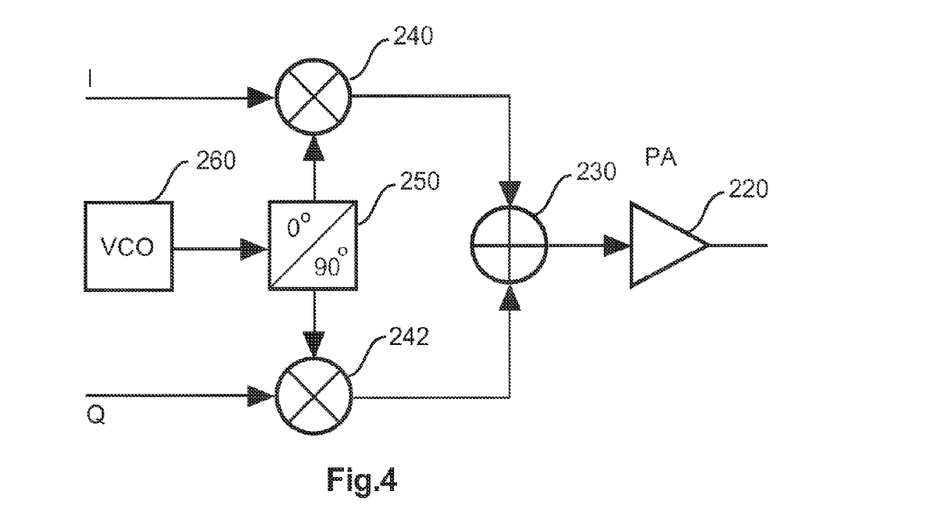
FIG. 4 shows a schematic block diagram of a direct conversion transmitter in which the present invention can be implemented.

FIG. 4 shows a schematic block diagram of a direct conversion transmitter according to a second embodiment. Similar to the above direct conversion receiver architecture, direct up-conversion is introduced in many applications for transmitter architectures, due to its high level integration option. As shown in FIG. 4, the LO frequency is equal to the carrier frequency, thus eliminating any intermediate up-conversion employed in a dual up-conversion architecture. Therefore, the image problem is no longer present and a high quality factor discrete RF filter in front of a PA 220 can be avoided. In the transmitter architecture of FIG. 4, baseband I and Q components are supplied to respective mixer circuits 240, 242 to which an in-phase component and a quadrature component of a local oscillator signal generated by a VCO 260 is applied. The required phase shift is obtained by a phase shifting circuit 250. Both mixer output signals are summed by an adder circuit 230 and supplied to the PA 220 in order to be transmitted via a wireless transmission channel.

Figure 7:
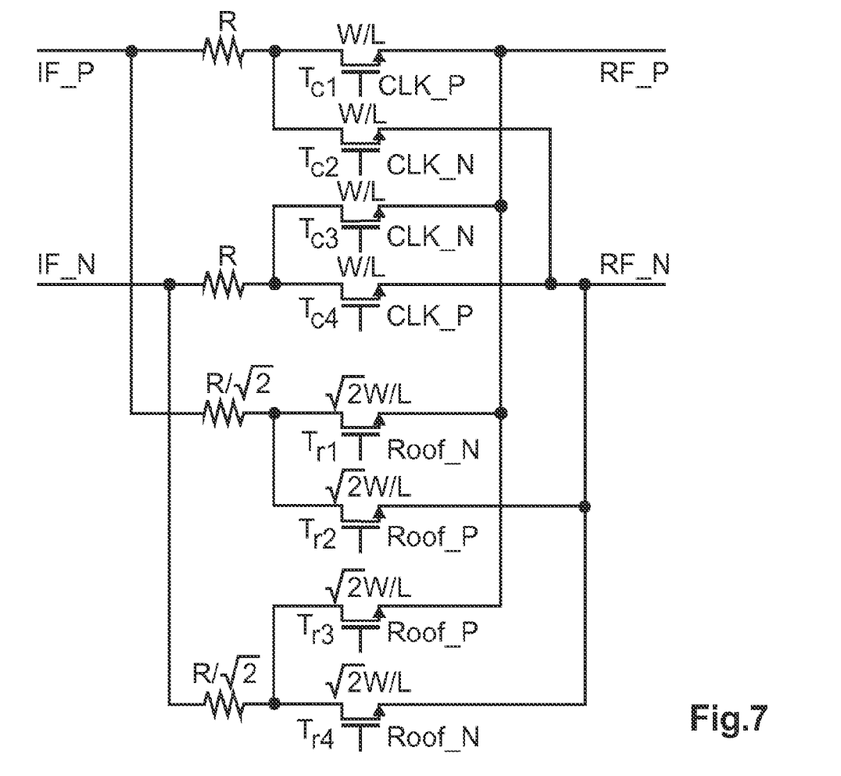
FIG. 7 shows a schematic circuit diagram of a mixer circuit in a sub-harmonic mode for frequency up-conversion.

FIG. 7 shows an example of the mixer circuits 240 and 242 of FIG. 4, which corresponds to the schematic circuit diagram of FIG. 2, wherein however an up-conversion is performed by suitable selection of the 50% duty cycle local oscillator signals CLK_P, CLK_N and the 25% local oscillator signals Roof_N, Roof_P, to thereby generate RF transmission output signals RF_P and RF_N. Contrary to the mixer circuit of FIG. 2, the 25% local oscillator signals are now applied with an inverted polarity, so that the mixer circuit is now switched from a harmonic-rejection mode to a sub-harmonic mode. Such a sub-harmonic mixer can also be applied to obtain frequency up-conversion in a transmitter circuit as shown in FIG. 4. In contrast to frequency down-conversion, it up-converts the IF input to a RF signal only at the 3rd order and the 5th order harmonics of the local oscillator. If the frequency of the local oscillator signal obtained by the VCO 260 is carefully selected to be ⅔ times of the carrier frequency of the RF signal, the VCO remodulation problem can be eliminated. Extra circuitry is only required for generating the 25% duty cycle local oscillator signal. Since this can be realized with digital circuitry operating in low frequency ranges, power consumption and chip area can be significantly reduced in comparison with conventional approaches based on frequency triplers.

By inverting the polarity of the 25% duty cycle local oscillator signals in the lower switching cores of FIG. 2, the harmonic-rejection mode can be switched to the sub-harmonic mode, as mentioned above.

Figure 5:
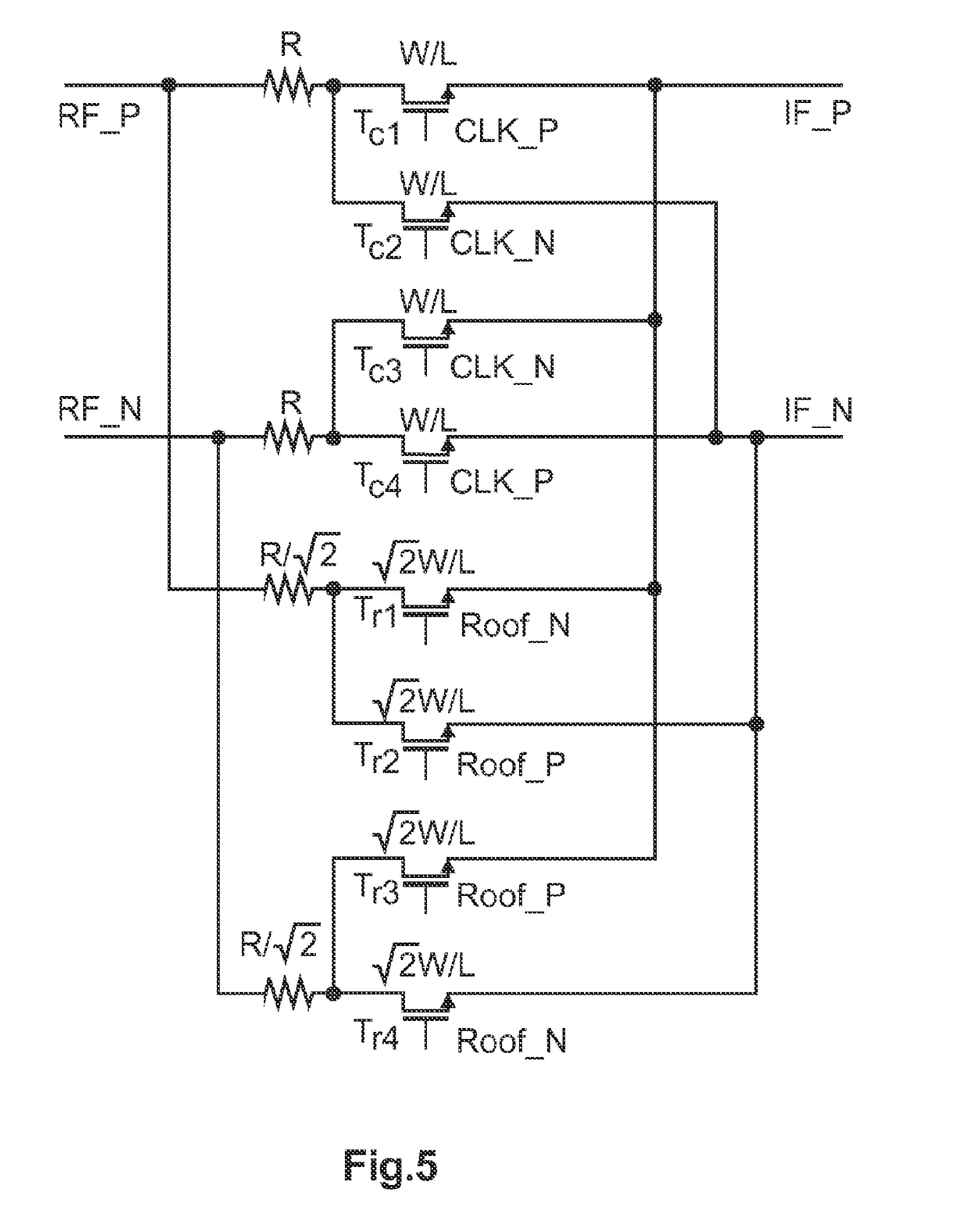
FIG. 5 shows a schematic circuit diagram similar to FIG. 2 but with an inverted polarity of a local oscillator signal to obtain a sub-harmonic mode.

FIG. 5 shows a schematic circuit diagram of the mixer circuit of FIG. 2, wherein the 25% duty cycle local oscillator signals have been inverted in their polarity, similar to FIG. 7. Thereby, the mixer circuit can be switched from the harmonic-rejection mode to the sub-harmonic mode in the receiver circuit of FIG. 1.

Figure 6:
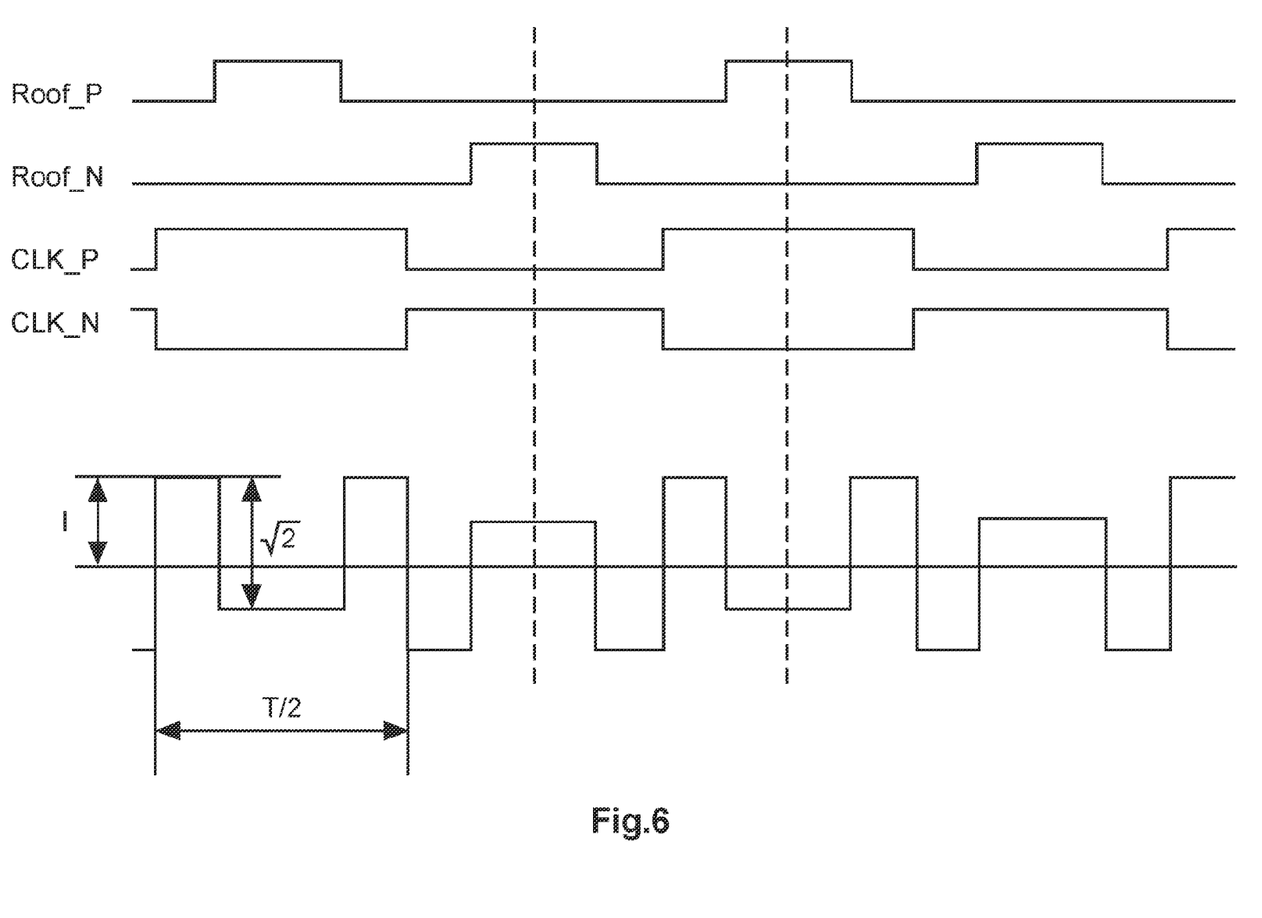
FIG. 6 shows local oscillator waveforms in the sub-harmonic mode.

FIG. 6 shows waveforms of the 25% and 50% duty cycle local oscillator signals and the resulting output current of the mixer circuit, which is now obtained by subtracting the current yielded by the lower switching core from the current yielded by the upper switching core. Now, the spectrum of the equivalent local oscillator waveform in case of an operation of the mixer circuit in the sub-harmonic mode is odd-symmetrically and its period is T. The associated Fourier series can be approximated as follows:

$$F \approx b_1 \cdot \sin \omega t + b_3 \cdot \sin 3\omega t + b_5 \cdot \sin 5\omega t + b_7 \cdot \sin 7\omega t + b_9 \cdot \sin 9\omega t, \text{ wherein } \omega = 2\pi/T.$$

Calculation of the coefficients reveals that $b_1=0$, $b_3=8/3\pi$, $b_5=8/5\pi$, $b_7=0$, and $b_9=0$. It can thus be observed that the coefficients $b_1$, $b_7$, and $b_9$ of the Fourier series are zero. This means that the RF signal at the fundamental, 7th order, 9th order harmonics of the local oscillator frequency will be completely rejected by the sub-harmonic mixer during frequency translation or transformation. In contrast to the harmonic-rejection mode, in the sub-harmonic mode the RF signal with frequencies at the 3rd order and the 5th order harmonics of the local oscillator will now be transformed to baseband in a receiver circuit, or the baseband will be transformed to the 3rd order and 5th order harmonics in a transmitter circuit. Since the distance between the 3rd order harmonics and the 5th order harmonics is large, a RF pre-select filter can reject the RF interference at the unwanted order. This gives freedom to choose either the 3rd order harmonic or the 5th order harmonic in real applications. It is noted that choosing the 3rd order harmonic can achieve higher conversion gains.

Figure 8:
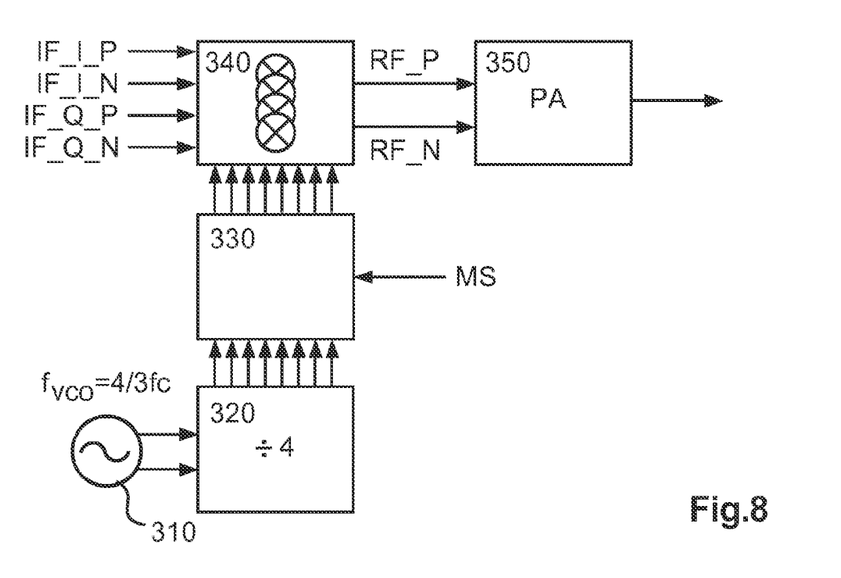
FIG. 8 shows a schematic block diagram of a transmitter with sub-harmonic mixer circuit according to an embodiment.

FIG. 8 shows a schematic block diagram of a transmitter circuit comprising a VCO 310 which generates a local oscillator frequency $f_{VCO}=\frac{4}{3} f_C$ which is supplied to a divide-by-four circuit 320, where four phases of the local oscillator signal are generated with positive and negative polarity. These four phases are supplied to a waveform combining circuit 330 which generates desired waveforms to be supplied to a mixer circuit 340 which may correspond to the mixer circuit of FIG. 7 or another type of mixer circuit described later in connection with FIG. 9.

In the transmitter architecture of FIG. 8, in-phase and quadrature phase baseband signals with positive and negative polarity are up-converted by the mixer circuit 340 to obtain RF signals of positive and negative polarity supplied to a PA 350 in order to be transmitted via a transmission channel. According to the embodiments, the waveform combiner circuit 330 has a mode selection input MS, by means of which the mixer circuit 340 can be switched between a harmonic-rejection mode and a sub-harmonic mode. In the present case, where the mixer circuit 340 is applied in a transmitter, the mode selection input MS is set so as to ensure that the mixer circuit 340 is operated as a sub-harmonic mixer for frequency up-conversion. However, by providing the controllable waveform combiner circuit 330, the mixer circuit 340 could as well be implemented in both modes in a receiver circuit.

Figure 9:
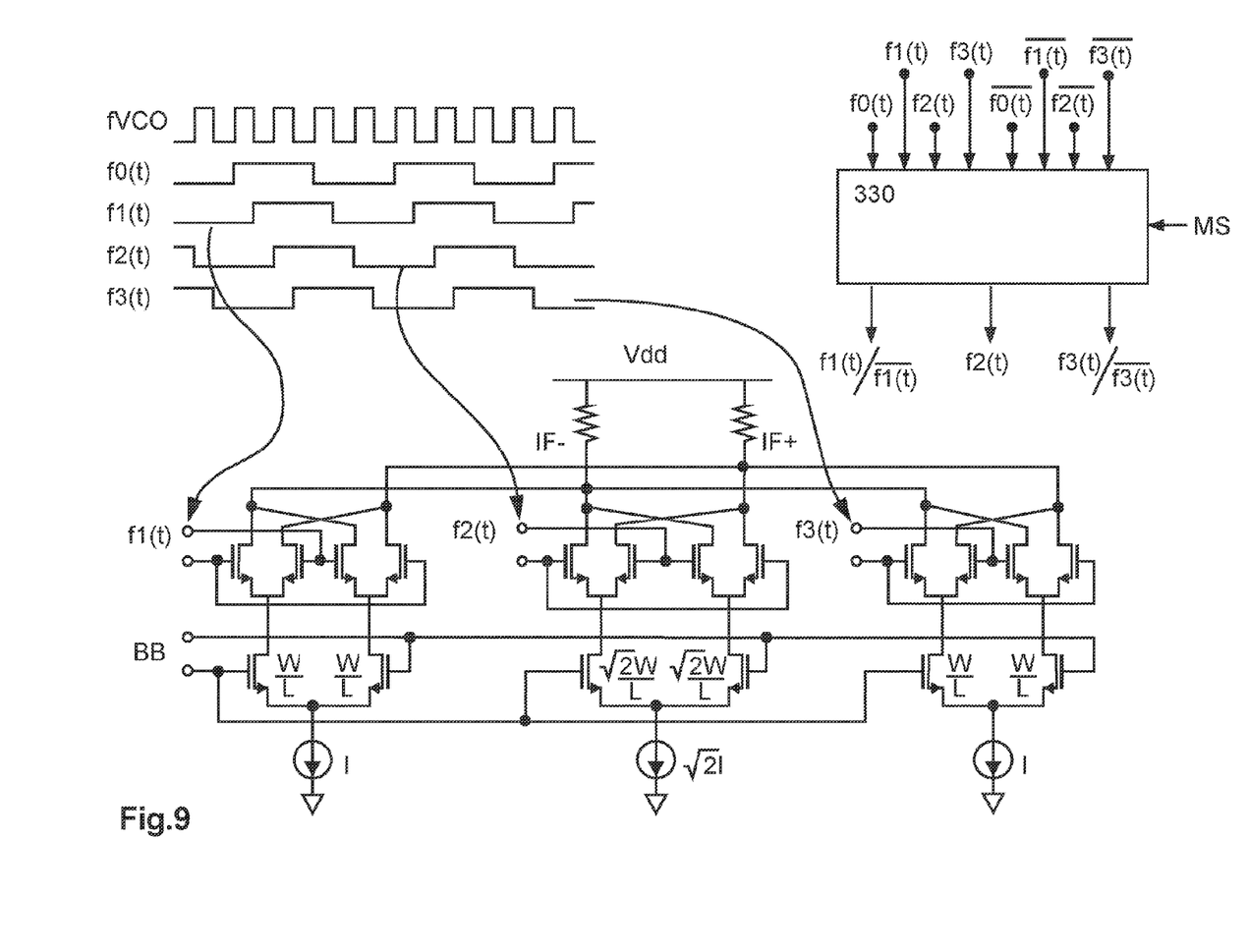
FIG. 9 shows a harmonic-rejection mixer circuit according to an embodiment.

FIG. 9 shows a schematic circuit diagram of a mixer circuit which can be applied as the mixer circuit 340 of FIG. 8, according to a third embodiment. Additionally, FIG. 9 shows waveforms of the local oscillation signal fVCO generated by the VCO 310 and phase signals f0(t), f1(t), f2(t) and f3(t) to be supplied via the waveform combiner 330 to the mixer circuit 340. Each of four mixers provided in the mixer circuit 340 to translate or transform the frequency of a desired signal from baseband to IF is realized with three active current-commuting sub-mixers all feeding common resistive loads connected to a voltage supply line Vdd, as shown in FIG. 9.

Each of the three sub-mixers of FIG. 9 receives the same baseband input BB through scaled input devices. However, the switches in each sub-mixer are driven by respective ones of the four phase components generated by the divide-by-four circuit 320 based on the local oscillator signal. Each sub-mixer generates a typical square wave response with the expected harmonics. However, when the signals are summed at the above resistors connected to the supply voltage Vdd, the baseband signal is effectively multiplied by a three-level, amplitude-quantized sign wave ideally having no 3rd or 5th harmonic content. Both I and Q local oscillator signals are generated using three of the four available phase components f0(t) to f3(t). In the present example of FIG. 9, the three phase components f1(t), f2(t) and f3(t) are supplied to the sub-mixers. As can be gathered from FIG. 9, the middle sub-mixer generates a current which is √2 times higher than the currents of the left and right sub-mixers.

Figure 10:
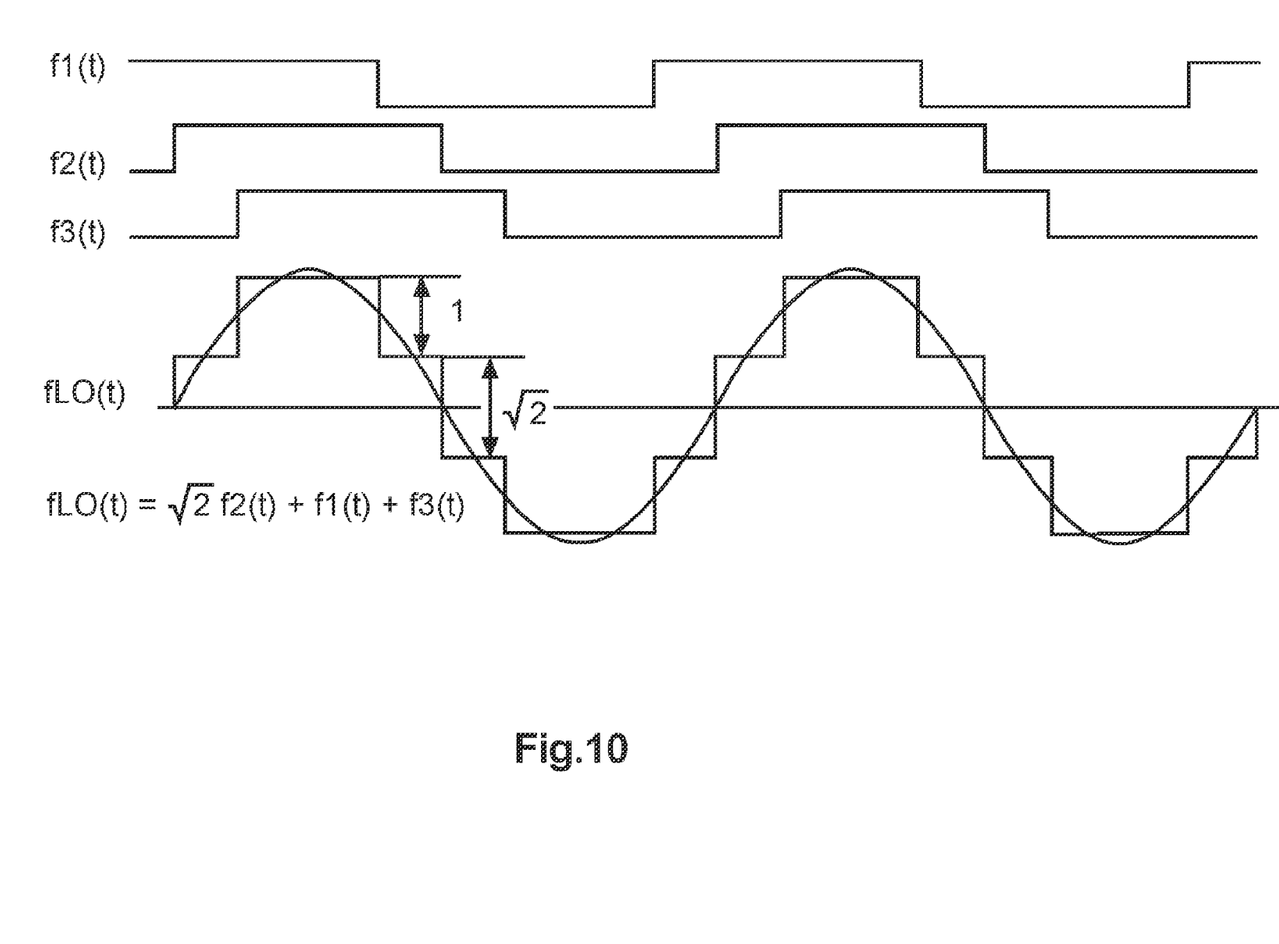
FIG. 10 shows waveforms for harmonic-rejection signal generation.

FIG. 10 shows waveforms of the three phase signals supplied to the sub-mixers and an output signal fLO(t) obtained at the right upper transistor as output signal IF+. Thus, the summing of all currents switched according to the phase signals f1(t) to f3(t) leads to a sign wave signal similar to FIG. 3.

Additionally, as can be gathered from the upper right portion of FIG. 9, the waveform combiner circuit 330 can be controlled by the mode selection input MS to supply either the direct phase component f1(t) or the inverted phase component $\overline{f1(t)}$ to the respective sub-mixer of the mixer circuit 340. Similarly, depending on the mode selection input MS, the third phase signal can be output either as direct signal f3(t) or inverted signal $\overline{f3(t)}$. However, in the present example, the mode selection input MS has no influence on the output of the second phase signal f2(t). By switching the polarity of the first and third phase components f1(t) and f3(t) the mixer circuit 340 can be switched from the harmonic rejection mode of FIG. 10 to a sub-harmonic mode.

Figure 11:
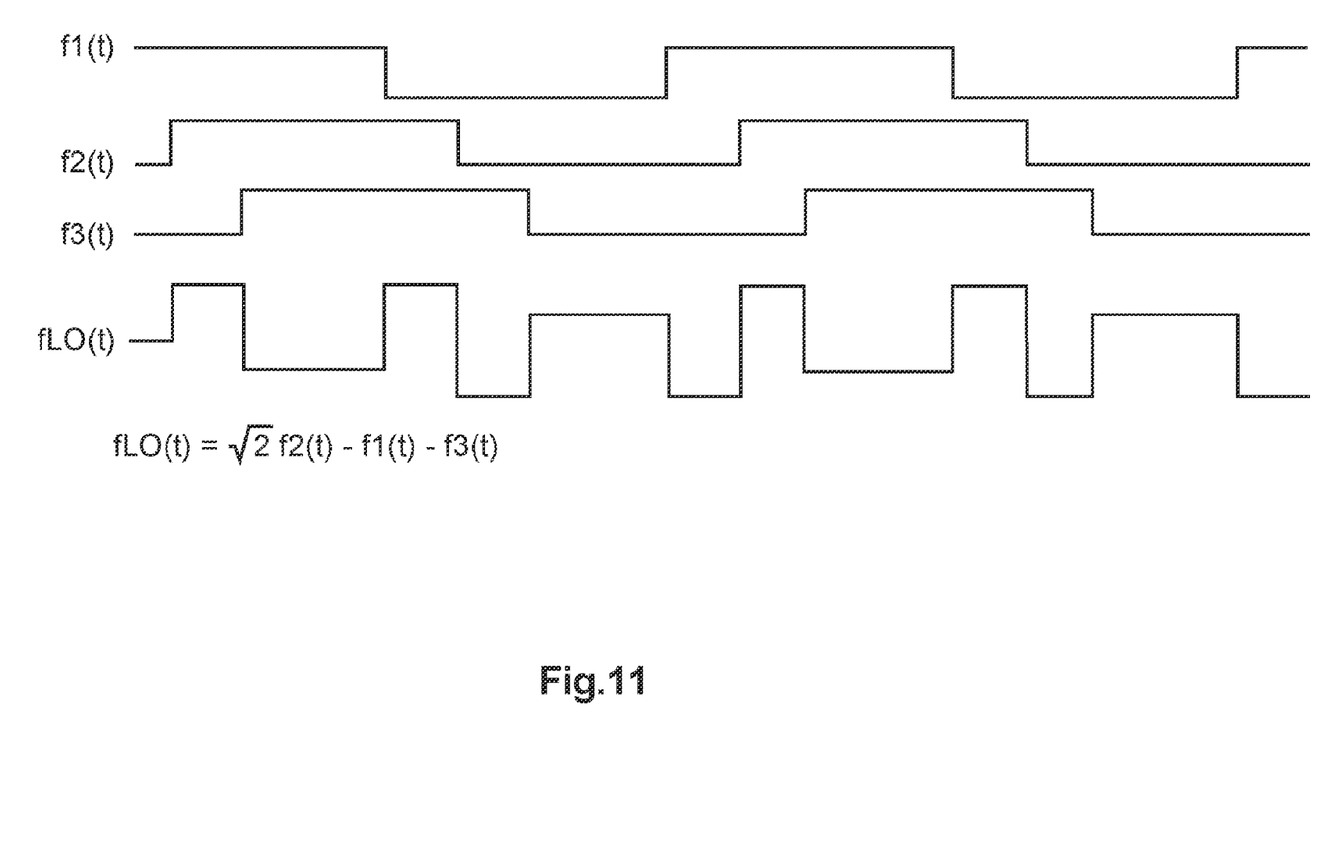
FIG. 11 shows waveforms for a sub-harmonic mixer.

FIG. 11 shows waveforms of the three selected phase components f1(t) to f3(t) and the combined output signal obtained by the three sub-mixers of FIG. 9, wherein the first and third phase components f1(t) and f3(t) are now subtracted from the higher second phase component √2 f2(t) to obtain an output signal fLO(t) which reflects the sub-harmonic mode.

Thereby, the mixer circuit 340 in combination with the waveform combining circuit 330 can be applied in a flexible manner in transmitter and receiver architectures with a desired operation mode. The 50% duty cycle and 25% duty cycle local oscillation signals required for the mixer circuits of FIG. 2, FIG. 5 and FIG. 7 can as well be generated by the waveform combiner circuit 330 by suitably combining respective phase components output from the divide-by-four circuit 320.

The invention can be applied to all kinds of multi-mode receivers or transmitters operating in multiple frequency bands. When the proposed mixer circuits are configured as harmonic rejection mixers, they can function as a mixer core applicable for example in television on mobile (TVoM) applications where 3rd order and 5th order harmonic rejection is required. By switching the polarity of respective ones of the local oscillator signals (e.g. the 25% duty cycle local oscillator signals or the first and third phase signals f1(t) and f3(t), or any other suitable local oscillator signal or component) the proposed mixer can also work as mixer core of 2G and 3G applications as well as other applications, to thereby eliminate the DC offset problem.

Moreover, the sub-harmonic mixer itself can be applied to very high frequency applications, such as 60 GHz transceivers, where it is difficult to obtain high frequency VCO and divider circuits operating at 60 GHz or higher. In contrast to even-harmonic mixers, the local oscillator in the proposed odd-harmonic mixer can operate at one fifth of the desired RF frequency, thus saving significant power. Additionally, the proposed sub-harmonic mixer can also be applied to RF SoC applications where the PA is integrated into the same chip with the RF transceiver, to thereby eliminate the VCO remodulation problem in the transmitter.

Of course, other duty cycle ratios and phase relationships could be used as the above local oscillator signals to generate local oscillator signals suitable for the proposed polarity switching. The preferred embodiments may thus vary within the scope of the attached claims.

Finally but yet importantly, it is noted that the term "comprises" or "comprising" when used in the specification including the claims is intended to specify the presence of stated features, means, steps or components, but does not exclude the presence or addition of one or more other features, means, steps, components or group thereof. Further, the word "a" or "an" preceding an element in a claim does not exclude the presence of a plurality of such elements. Moreover, any reference sign does not limit the scope of the claims.

The invention claimed is:

1. A mixer circuit for transforming a frequency of an input signal, said mixer circuit comprising:
    a first switching arrangement for switching said input signal in accordance with a first local oscillator signal;
    at least one second switching arrangement for switching said input signal in accordance with at least one second local oscillator signal, said at least one second local oscillator signal having a smaller duty cycle than said first local oscillator signal;
    a summing device for summing output currents generated by said first and second switching arrangements; and
    a switching control device for switching the polarity of one of said first local oscillator signal and said at least one second local oscillator signal with respect to the other in response to a control input, to switch between a harmonic-rejection mode and a sub-harmonic mixing mode of said mixer circuit.

2. The mixer circuit according to claim 1, wherein said first local oscillator signal is a 50% duty cycle signal and said at least one second local oscillator signal is a 25% duty cycle signal with coinciding pulse center.

3. The mixer circuit according to claim 1, wherein said first local oscillator signal is a first one of four phases generated by a divide-by-four circuit, and said at least one second switching arrangement comprises two switching arrangements switched in accordance with a second and, respectively, a third one of said four phases generated by said divide-by-four circuit.

4. The mixer circuit according to claim 1, wherein said mixer circuit is configured to operate as a frequency down-converter.

5. The mixer circuit according to claim 1, wherein said mixer circuit is configured to operate as a frequency up-converter.

6. A transceiver module comprising a mixer circuit according to claim 1, integrated on a single chip.

7. A transmitter comprising a mixer circuit according to claim 5.

8. A receiver comprising a mixer circuit according to claim 4.

9. A method of frequency transformation comprising:
    switching an input signal in accordance with a first local oscillator signal;
    switching said input signal in accordance with at least one second oscillator signal having a smaller duty cycle than said first oscillator signal;
    summing output signals obtained by said switching in accordance with said first and at least one second local oscillator signals; and
    switching the polarity of one of said first local oscillator signal and said at least one second local oscillator signal in response to a control input, to switch between a harmonic-rejection mode and a sub-harmonic mixing mode.

10. The method of frequency transformation of claim 9, further including generating said first local oscillator signal by a divide-by-four circuit.

11. The method of frequency transformation of claim 9, further including providing said first local oscillator signal at a 50% duty cycle signal and providing said at least one second local oscillator signal at a 25% duty cycle signal with a coinciding pulse center.

12. A mixer circuit for transforming a frequency of an input signal, said mixer circuit comprising:
    a first switching arrangement for switching said input signal in accordance with a first local oscillator signal having a 50% duty cycle signal;
    at least one second switching arrangement for switching said input signal in accordance with at least one second local oscillator signal, having a 25% duty cycle signal, said at least one second local oscillator signal having a respective predetermined phase shift with respect to said first local oscillator signal;
    a summing device for summing output currents generated by said first and second switching arrangements; and
    a switching control device for switching the polarity of one of said first local oscillator signal and said at least one second local oscillator signal with respect to the other in response to a control input, to switch between a harmonic-rejection mode and a sub-harmonic mixing mode of said mixer circuit.

13. The mixer circuit according to claim 12, wherein said first local oscillator signal is a first one of four phases generated by a divide-by-four circuit, and said at least one second switching arrangement comprises two switching arrangements switched in accordance with a second and, respectively, a third one of said four phases generated by said divide-by-four circuit.

* * * * *